(12) United States Patent
Pham

(10) Patent No.: US 7,228,645 B2
(45) Date of Patent: Jun. 12, 2007

(54) MULTI-ZONE SHOWER HEAD FOR DRYING SINGLE SEMICONDUCTOR SUBSTRATE

(76) Inventor: Xuyen Ngoc Pham, 43520 Laurel Glen Common, Fremont, CA (US) 94539

( * ) Notice: Subject to any disclaimer, the term of this patent is extended or adjusted under 35 U.S.C. 154(b) by 55 days.

(21) Appl. No.: 11/032,852

(22) Filed: Jan. 11, 2005

(65) Prior Publication Data

US 2006/0150432 A1   Jul. 13, 2006

(51) Int. Cl.
 *F26B 17/24* (2006.01)
(52) U.S. Cl. ............... 34/58; 34/90; 118/73; 118/608; 427/240
(58) Field of Classification Search ............... 34/352, 34/90, 92, 58; 118/73, 608; 427/240
See application file for complete search history.

(56) References Cited

U.S. PATENT DOCUMENTS

| | | | | |
|---|---|---|---|---|
| 4,510,176 A * | 4/1985 | Cuthbert et al. ............ 438/780 |
| 5,368,054 A * | 11/1994 | Koretsky et al. ............ 134/153 |
| 5,762,709 A * | 6/1998 | Sugimoto et al. ............ 118/52 |
| 5,951,373 A * | 9/1999 | Shendon et al. ............ 451/41 |
| 5,954,878 A * | 9/1999 | Mandal et al. ............ 118/319 |
| 6,164,297 A * | 12/2000 | Kamikawa ............ 134/61 |
| 6,248,168 B1 * | 6/2001 | Takeshita et al. ............ 118/52 |
| 6,590,344 B2 * | 7/2003 | Tao et al. ............ 315/111.21 |
| 6,632,292 B1 * | 10/2003 | Aegerter et al. ............ 134/33 |
| 6,830,619 B2 * | 12/2004 | Shirley ............ 118/73 |
| 2002/0127334 A1 * | 9/2002 | Gurer et al. ............ 427/240 |

\* cited by examiner

*Primary Examiner*—S. Gravini
(74) *Attorney, Agent, or Firm*—Tue Nguyen

(57) ABSTRACT

A shower head processes a wafer with a plate having a plurality of nozzles positioned thereon, each of the nozzles assigned to one of a plurality of processing zones for the wafer; and a manifold assembly coupled to each of the nozzles to control one or more of the nozzles as a group in each processing zone.

8 Claims, 14 Drawing Sheets

MULTI-ZONE SHOWER HEAD FOR DRYING SINGLE SEMICONDUCTOR SUBSTRATE

BACKGROUND

This invention relates to systems and methods for processing semiconductor wafers.

In semiconductor fabrication, various layers of insulating, conducting and semi-conducting materials are deposited to produce a multilayer semiconductor device. Using various fabrication techniques such as coating, oxidation, implantation, deposition, epitaxial growth of silicon, lithography, etching, and planarization, the layers are patterned to form elements such as transistors, capacitors, and resistors. These elements are then interconnected to achieve a desired electrical function in an integrated circuit (IC) device.

In many operations, residual unwanted materials such as post-etch/post-strip chemicals and slurry particles accumulate on the surface of a wafer. If left on the surface of the wafer for subsequent fabrication operations, these unwanted residual materials and particles may cause, among other things, defects such as scratches on the wafer surface and inappropriate interactions between metallization features. In some cases, such defects may cause devices on the wafer to become inoperable.

To illustrate, fabrication operations such as plasma etching, stripping and chemical mechanical polishing (CMP) may leave unwanted residuals on the surface of the wafer. These unwanted residuals may be removed using water washing, chemical washing, sonic washing (for example Megasonic and ultrasonic), and brush cleaning with deionized (DI or DIW) water, or a separate post-CMP cleaning. The post-CMP step is typically achieved by mechanical brush cleaning, using a polyvinyl alcohol (PVA) brush or sponge and DI water, or potassium or ammonium hydroxide as the cleaning agent. Other surface preparation processes can include chemical processes using various liquid chemicals.

After the cleaning operation, a rinse is applied with DI water and a drying process is performed. One of the substrate drying processes conventionally known in the art is a spin dry process for rotating a substrate at high speeds to spin off water from the surface of the substrate by centrifugal force in a single-wafer type substrate processing apparatus for processing substrates one by one.

One purpose of drying the substrates is to remove water on the substrates after cleaning. Currently several drying methods have been used in electronic component industry. The methods include a spin-rinse dry method, a hot water slow pull method, a Marangoni-type process, and an isopropyl alcohol (IPA) process.

FIG. 1 shows an exemplary prior art of typical spinning apparatus. A wafer 10 is positioned above a wafer chuck 12, both of which are contained in a shroud 14. The chuck 12 is connected to one end of a spindle shaft 19, while the other end of the spindle shaft 19 is connected to a pulley 20. The shaft 19 is centered in a spindle housing 18 using a plurality of spindle bearings 16. The pulley 20 is driven by a belt 22, which in turn is connected to a motor pulley 24. The motor pulley 24 is connected to a motor 26 which, when activated, rotates the pulley 20 to rotate the shaft 19 and the chuck 12 to spin the wafer 10 resting above the chuck 12.

The spin-rinse dryer uses centrifugal forces to remove water from substrate surfaces. However, spin-rinse dryer is known to have problems such as water spotting, static electric charge build-up, and stress-induced substrate damage due to high speed spinning about 2500 RPM. In the hot water slow pull method, the substrates are immersed in a hot water bath, which is heated to 80–90° C., and then slowly pulled from the bath. When a substrate is pulled from the bath, a thin water film is formed on the surface of the substrate. Then, the thermal energy stored in the substrate evaporates the thin water film. For successful evaporation, the rate at which the substrate is separated from the bath must be matched to the evaporation rate. The hot water process has several shortcomings. When the substrate has a non-homogeneous surface, partly hydrophobic and partly hydrophilic, the substrate is likely to have watermarks or stains thereon. Further, condensation of water vapor on the substrate after the substrate is pulled from the hot water may produce watermarks or stains on the substrate.

Since spin dryers or IPA vapor dryers cannot completely remove watermarks that occur on a wafer surface or between patterns, Marangoni dryers have been developed. The Marangoni dryer uses a difference between surface tenses of the IPA and water. The Marangoni-type process involves the introduction of a polar organic compound which dissolves in the liquid and thereby reduces the surface tension of the liquid. U.S. Pat. No. 6,027,574, entitled "METHOD OF DRYING A SUBSTRATE BY LOWERING A FLUID SURFACE LEVEL", shows a Marangoni-type process. According to the Maringoni principle, fluid flows from low surface tension region to high surface tension region. In the Marangoni-type process, while the substrate is separated from the bath containing water that is at room temperature, the water is driven away from the substrate because of the Marangoni effect. To avoid condensation of water vapor on the surface of the substrate, the Marangoni-type process does not use hot water. After wafers are rinsed out by de-ionized water, the IPA vapor is fed to an upper interior space of a rinsing bath and the DI water is slowly withdrawn. Thus, the water is eliminated from a wafer surface. When the DI water is completely drained, the nitrogen of high temperature is fed into to evaporate the DI water remaining on the wafer surface. If the evaporated DI water and residues including particles are not fully issued out, they can cause the irregular liquid flow (turbulence) in the rinsing bath together with the nitrogen, so that the wafer surface is not uniformly dried and the water remains at a portion contacting with a wafer guide. In addition, since the Marangoni dryer cannot fundamentally prevent oxygen from reacting on the wafer, it cannot suppress formation of an oxide layer.

As noted in U.S. Pat. No. 6,625,901, several issues arise with conventional Marangoni-type process. First, the drying speed of the process is low, because the substrate is dried at room temperature, and the chamber is purged of the remaining IPA vapor for an extended period of time (3–5 minutes) after being removed from the water. Accordingly, drying cost is high. Second, although room temperature water is used, there is still a condensation problem during and after the separation of the substrate from the water. Water vapor condenses on the substrate and forms micro droplets that leave a residue behind, causing defects in subsequent manufacturing processes. Fourth, purging of IPA while the substrate is dried in the chamber may cause condensation of water vapor.

SUMMARY

In one aspect, a multi-zone shower head includes a plate having zones of plurality nozzles positioned thereon, each of the nozzle zone assigned to one or more of a plurality of processing zones for the wafer; and a manifold assembly coupled to the pressure regulator or MFC to control one or more of the nozzle zones as a group in each processing zone.

Implementations of the above aspect may include one or more of the following. The multi-zone shower head plate assembly can include an upper plate having plurality of input cavity chambers for each subsequence nozzle zone of lower plate; and a lower plate having plurality of nozzle zones mating with each upper chamber. Each processing zone can provide an aqueous vapor flow, a gas, a gas mixture or a compressed liquid. A plurality of control device can be used with the manifolds to control volume, flow rate, and pressure of each processing zone. The processing zones can include a plurality of nitrogen and IPA vapor zones. The nozzles can be spaced apart from each other between approximately 0.06 inch and 0.25 inch (preferably 0.010 inch). Each nozzle can be angled outwardly from center of wafer approximately between 0 and 45 degrees (preferably 20 degrees) and can have a nozzle diameter approximately between 0.01 inch and 0.06 inch (preferably 0.015 inch). Each zone can be separated by a distance approximately between 0.5 inch and 2.00 inches (preferably 1 inch). The plate surface can be a flat surface, a concave surface or a convex surface. The processing zones can be shaped as concentric rings, rectangular rings, linear rings, or radial rings. Alternatively, the processing zones can be circular zones, square zones, triangular zones, rectangular zones or linear zones. An outer processing zone can be used to dry a wafer edge (with less than 20 nozzles in one embodiment). A rotating platform can be used to rotate the wafer. The platform can generate a centrifugal force during wafer spinning to urge an aqueous solution to move toward a wafer edge. The aqueous solution can be DIW and can be rinsed to remove any chemical residues on the wafer. The processing zones can flow N2/IPA mixture or heated nitrogen during wafer rotation to evaporate residual thin film on the wafer and to prevent water marks on the wafer. An actuator such as a motor or an air actuator can be used to move the shower head assembly plate up/down or rotate left/right or pivot up/down the plate (preferably the shower head assembly is moved vertically in an up/down manner). The shower head assembly plate can be concentric or non-concentric with the wafer or the assembly plate can be concentric or non-concentric with the platform to rotate the wafer. Additional nozzle head(s) can access second (back side) sides of the wafer for additional processing.

In another aspect, a system for fabricating a wafer having first and second sides includes a platform adapted to receive and rotate the wafer; a shower head positioned above the first side (front side), the shower head having plurality of nozzle zones positioned thereon to process the first side (front side); and second nozzle heads coupled to the platform to access the second side (back side) of the wafer.

Implementations of the above apparatus can include one or more of the following. A drive assembly can actuate the platform. A first bowl can collect material from the first head and a second bowl can collect material from the second head. A moveable shroud is used to load/unload the wafer and contain material from one or more of the heads. The nozzles can discharge air, gas, or a mixture thereof. The nozzles can also discharge a liquid material, a chemical material or a gaseous material. The wafer can be positioned offset from the shower head.

The shower head can be fabricated from a variety of material and surface finishing. The air nozzles can be spaced from 0.06+0.25" (preferably 0.1"). The angle of nozzle is tilting from 0 to 45 degree (15 degree preferred). The nozzle size is from 0.01 to 0.06" (preferably 0.015"). The spacing of each zone is from 0.5 to 2.0" (preferably 0.9"). The surface of the shower head is not limited to a flat surface; it can be made as concave or convex surface. The shower head can arrange the nozzles in concentric rings, linear spacing radically or combined of both designs. The outer edge zone can be used to dry wafer edge.

In a system embodiment, the shower head is located at the top of the substrate spinning apparatus, and can move up/down at the appropriate position by air cylinder or motor. A 0.10 to 2 inch gap position between the shower head and the wafer for each required processing operation can be controlled by motor or air cylinder (preferably 0.25 inch). The shower head can move vertically above the wafer, and alternatively can be rotated and pivoted up and down, and can be rotated side way as well as moved up and down. The shower can be located concentric or not to the wafer spinning apparatus. Its also can located concentric to wafer spinning apparatus but still have the wafer offset from the spinning apparatus.

In another implementation where the processing zones are multi-air zones, the shower head with multi-air zones control an aqueous vapor flow, gases, gas mixture and wafer spinning apparatus to perform front wafer processes. Various combination of gas, gas mixture or liquid can be flowed through the shower head zones. The systems of manifold and control device enable a precise control of volume, flow rate, and pressure of each zone. The shower head with multi-air zones controlled nitrogen/IPA or an aqueous vapor flow and wafer rotation apparatuses to dry front wafer and rotation arm with attached air nozzle(s) to dry the backside of the wafer. Combining the force from each circular nitrogen/IPA vapor air zones and the centrifugal force of the spinning wafer urges DIW or other aqueous based to move toward the edge of wafer.

In an exemplary Shower Head Vapor Dry (SHVD) process, DIW is rinsed to remove any chemical residues on wafer from previous cleaning processes. As required for surface treatments, nitrogen/IPA or an aqueous vapor can be used to coat the surface of wafer as (heated) DIW or other aqueous-based solutions floods the wafer surface for wetting the wafer surface. A controlled wafer rotation is performed and the multi-zone shower head applies N2/IPA vapors, starting from a center processing zone and moving to outer zones. The N2/IPA assists in drying the wafer using the Marangoni effect. The resulting surface tension gradient pushes water away from wafer center as it is rotated. Each circular air zone in shower head can continue to flow N2/IPA mixture or heated nitrogen at one or more wafer rotation speed(s) to evaporate residual thin films of liquid solutions on the wafer to prevent the formation of water marks on the wafer. This process save time, lower the cost for each wafer by eliminating the need for post-clean and batch IPA dry on porous and hydrophobic film of copper/low-k interconnects wafer without leaving water marks.

The foregoing methods and apparatuses for processing semiconductor wafers can be used in conjunction with other semiconductor processes as post-CMP clean/dry, Dry/wet Post-Etch Residue cleans (Polymer Removal), Photoresist Removal and surface preparation (FEOL & BEOL), Pre-Photo Lithography, Pre-Deposition clean and dry, Back Side Metals Clean, Back Side Films Etch (Front side and/or backside), Pre-Epi Clean, among others. Such a Shower Head Vapor Dryer can be used with an integrated chamber and the system does not required transferring wafer from clean module to dry module, improving throughput and reduce wafer stress, wafer contamination and defectives.

One or more of the following advantages may be achieved. Water marks and wafer stress on the wafer are virtually eliminated using the multi-zone shower head and using centrifugal forces exerting during the slow spinning to dry wafer (5 to 600 RPM). The system efficiently dries the wafer after fabrication operations that leave unwanted residue on one or both surfaces of the wafer. The improved wafer cleaning/drying minimizes the undue costs of discarding wafers having inoperable devices.

Other aspects and advantages of the present invention will become apparent from the following detailed description, taken in conjunction with the accompanying drawings, illustrating by way of example the principles of the present invention.

BRIEF DESCRIPTION OF THE DRAWINGS

The present invention will be readily understood by the following detailed description in conjunction with the accompanying drawings. To facilitate this description, like reference numerals designate like structural elements.

DESCRIPTION

Figure 1:
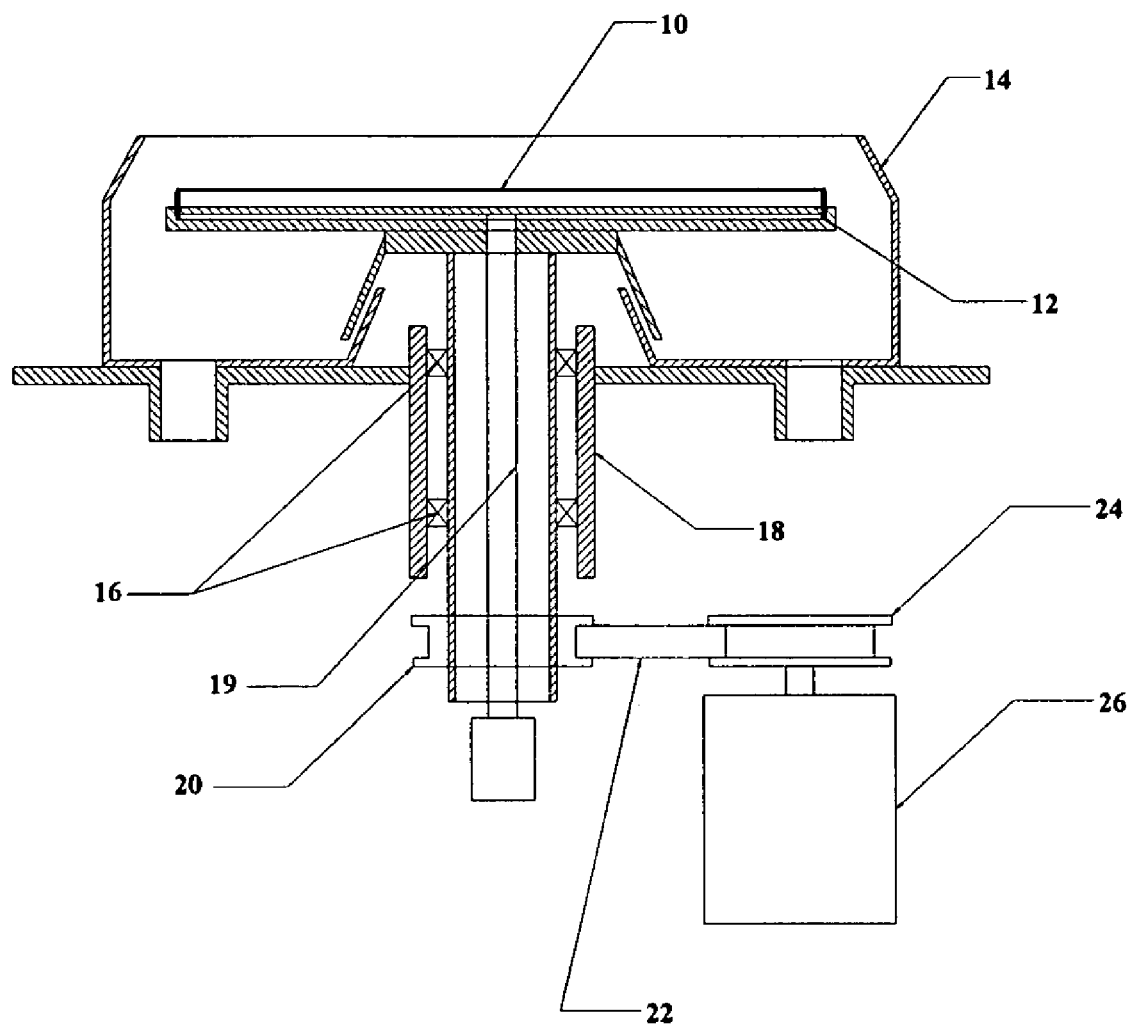
FIG. 1 shows an exemplary prior art typical apparatus.
Figure 2:
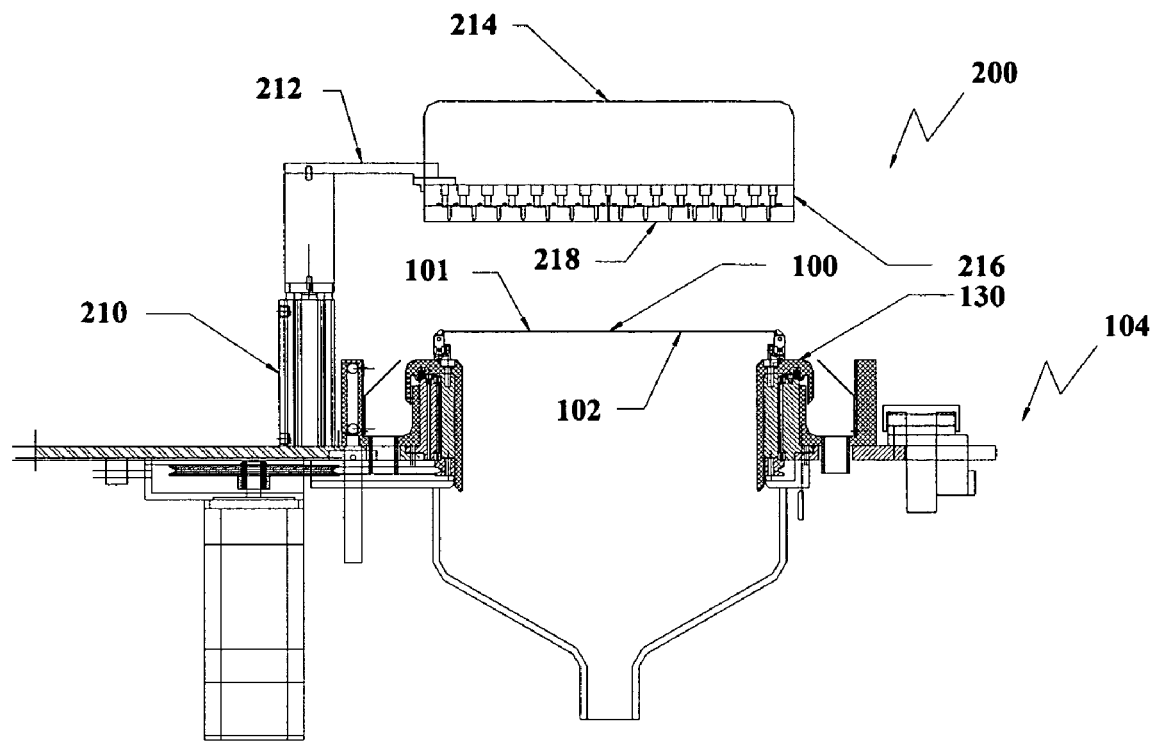
FIG. 2 illustrates an exemplary multi-zone shower-head system.
Figure 3:
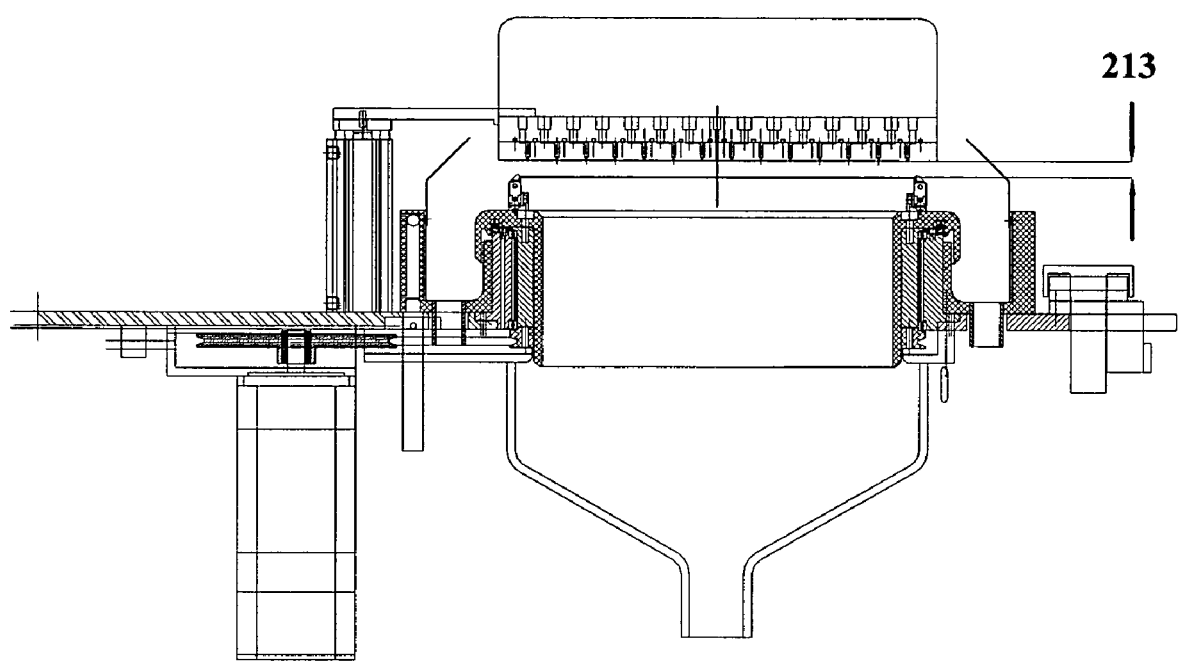
FIG. 3 illustrates the shower head system of FIG. 2 in a lower position for wafer drying process, among others.
Figure 4:
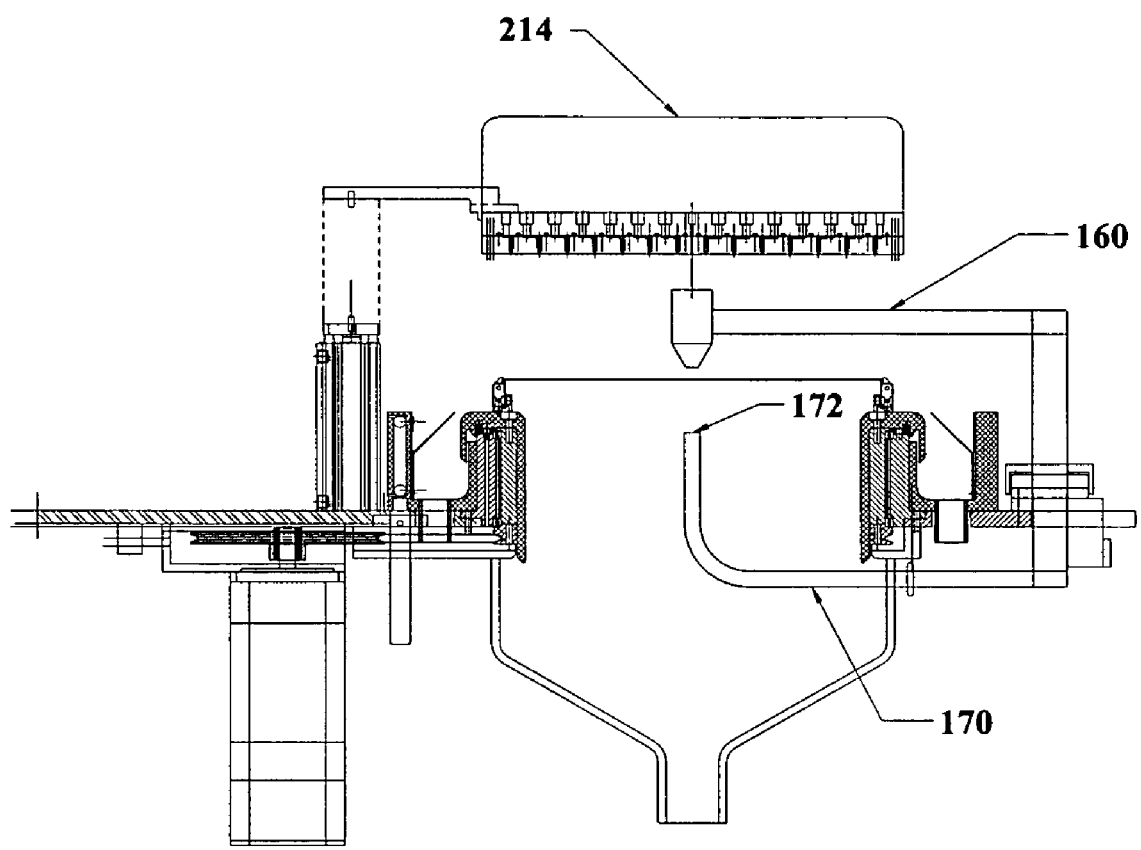
FIG. 4 illustrates the shower head system of FIG. 2 in an upper position for wafers load/unload, among others.
Figure 5:
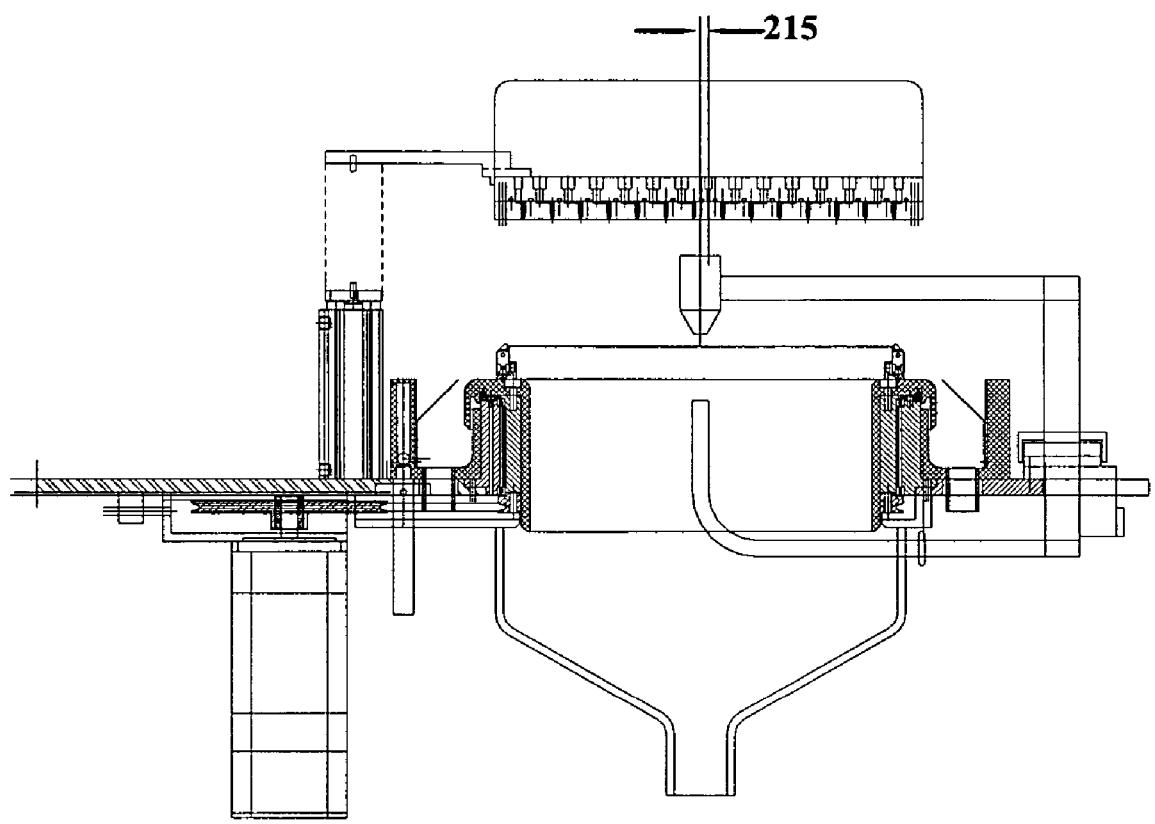
FIG. 5 illustrates the shower head system with the shower head located offset from a wafer center.

Referring now to FIGS. 2–4, an exemplary multi-zone shower head assembly 200 for processing wafers is shown. FIG. 2 illustrates an exemplary multi-zone shower-head system; FIG. 3 illustrates the shower head system of FIG. 2 in a processing position for drying wafer, among others; FIG. 4 illustrates the multi-zone shower head system of FIG. 2 in a upper position for wafer load/unload and among others; and FIG. 5 illustrates the shower head system of FIG. 2 with the shower head located offset from a wafer center.

Turning now to FIG. 2, the multi-zone shower head assembly 200 is moveably positioned above a wafer 100 using an actuator 210 that is connected to the head assembly 200 through an arm 212. The shower head assembly 200 includes a cover 214 that houses a plurality of air lines and fittings to each zone 230A, top plate 201 and bottom plate 203, as shown in more detail in FIGS. 6–7.

The wafer 100 has first and second sides 101 and 102 (in this case the front and back wafer sides) and is mounted on a platform 104 adapted to securely receive and rotate the wafer. FIG. 2 shows the assembly 200 at an upper position to enable both sides of the wafer 100 to be accessible by instruments such as process heads 160 and back side wafer drying nozzle 170 in FIG. 4, for example. FIG. 3 shows the assembly 200 at a processing position proximal to the wafer 100.

FIG. 3 illustrates the multi-zone shower head system of FIG. 2 in a closed position for drying wafer processes at a distance 213 above the wafer 100, while FIG. 4 illustrates the multi-zone shower head system of FIG. 2 in a upper position for wafer load/unload or other processes. As shown in FIG. 4, the apparatus 200 has a hollow center to allow first and second process heads 160 and arm 170 mounted on the platform 104 to access the first and second sides 101–102 of the wafer 100. In one embodiment, the first head 160 is positioned above the top side of the wafer 100 and the second head 172 is positioned below the bottom side of the wafer 100. The platform 104 allows nozzles and process heads to reach wafer from both sides without restriction.

In the embodiment of FIGS. 2–4, the wafer is a 300 millimeter wafer that seats above the inner housing 130. In yet another embodiment shown in FIG. 5, the wafer 100 is placed at an offset 215 from a spindle center.

Figure 6:
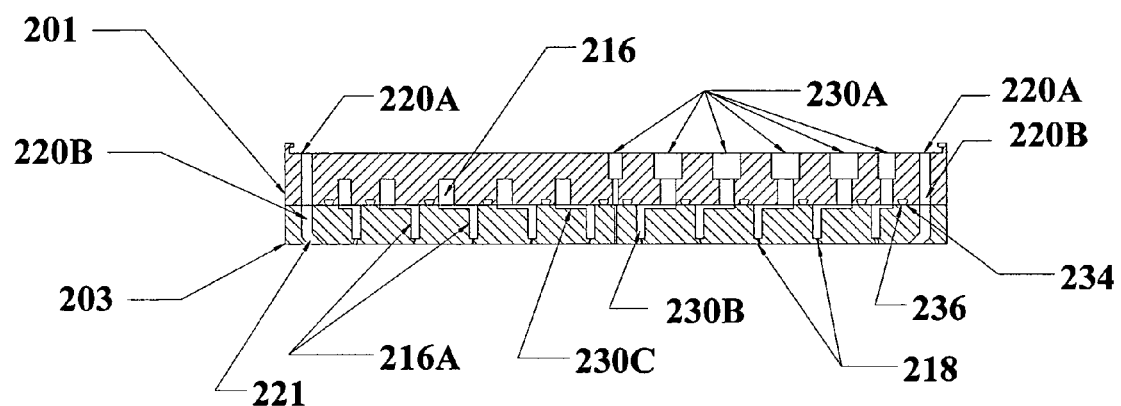
FIG. 6 shows a cross-sectional view of an exemplary 200 mm shower head assembly.
Figure 7:
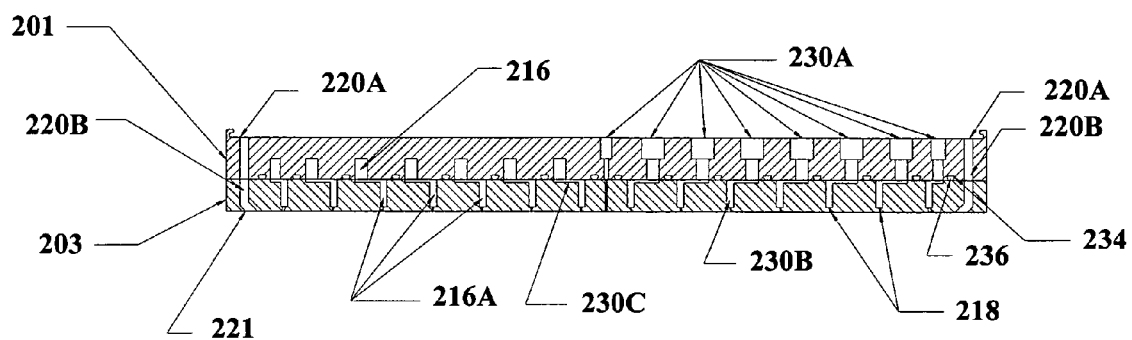
FIG. 7 shows a cross-sectional view of an exemplary 300 mm shower head assembly.

FIGS. 6–7 are cross sectional views of two embodiments of the multi-zone shower head 200. The shower head 200 is made up of top and bottom plates 201 and 203 and is typically fabricated from PPS, PET or Teflon. The showerhead 200 may alternatively be fabricated from ceramic or other materials for use in processes environment applications. The top and bottom plates 201 and 203 are secured to each other using a plurality of bolts.

In the plate 201, one or more liquid inlet tube feed through 220A. In one embodiment, the inlet tube feed through 220A is a cylinder that goes through both plates 201 and 203. Also positioned on the plate 201 is a plurality of gaseous fluid inlet fittings 230A that define a plurality of air chambers. In one embodiment, each inlet fitting 230A has a separate chamber 216 guide the gaseous fluid through narrow gap 230C from 0.005 to 0.040 inch (preferably about 0.015 inch) of the showerhead 200, this narrow gap has radial blocked segment to allow better flow distribution to the below chamber 230B of bottom plate 203. Additionally, multi-zone shower head assembly has a plurality of O-ring receptacles 234 between top plate 201 and 203. The O-ring receptacles 234 are adapted to receive O-rings 236 to isolate each zone from its neighbors.

The bottom plate 203 has a corresponding liquid inlet tube feed through 220B that cooperates with the inlet tube 220A. The inlet tube feed through 220B terminates in an angle cut 221 about 30 degree and can be used to feed liquid lines for flooding wafer during wafer drying.

Figure 8A:
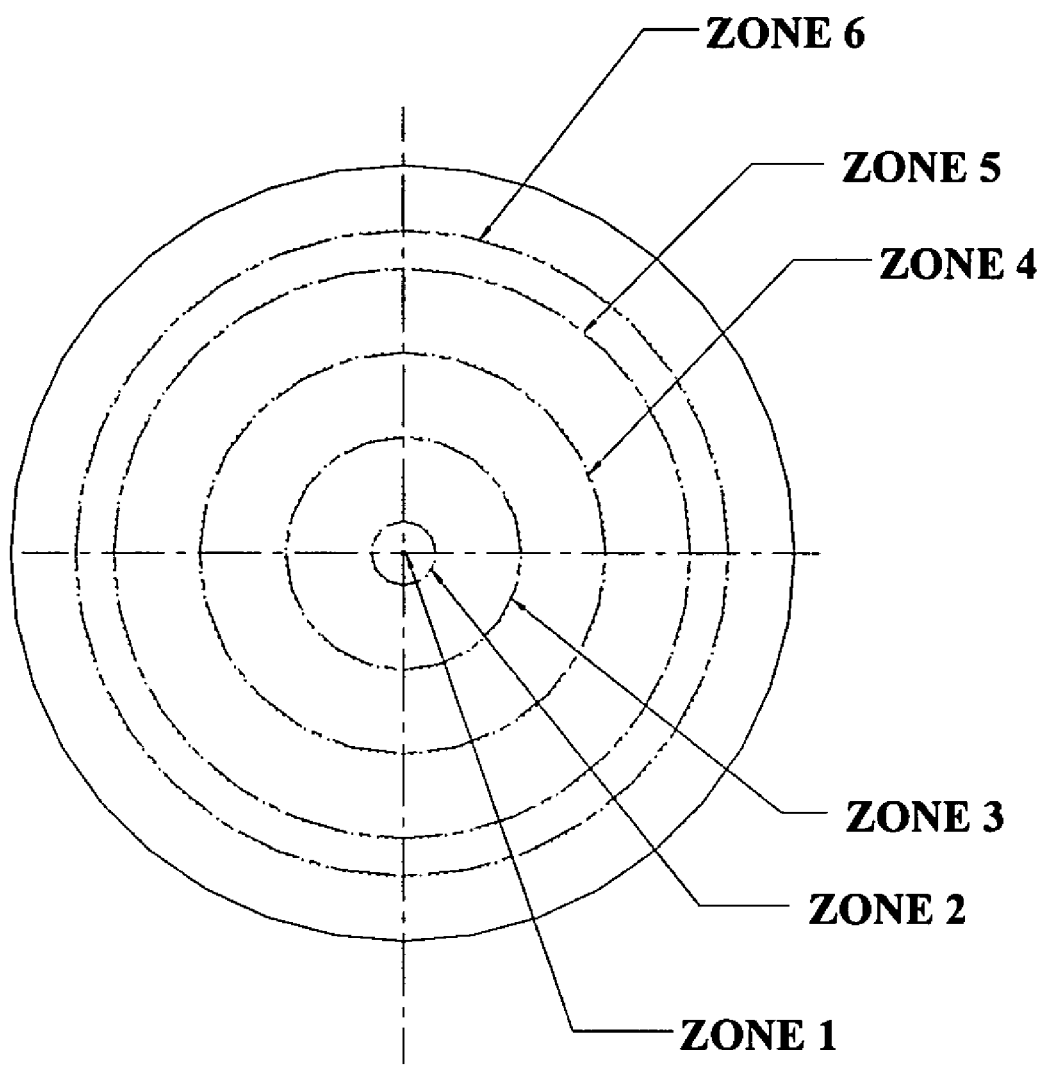
FIGS. 8A–8B illustrate a first exemplary circular air zone patterns and a cross-sectional view of the head that generates the pattern of FIG. 8A.

In combination, plates 201 and 203 form a multi-zone shower head assembly 200 having a plurality of hole or nozzle zones 218 passing through the showerhead 200. Generally, the holes are disposed in a polar array as shown in FIG. 8A. The zone 218 may alternatively be disposed in other patterns or randomly disposed throughout the perforated bottom of plate 203. The number of nozzle zones 218 and the nozzle diameters/angulations are typically selected to provide flow uniformly of gases passing through the showerhead 200.

Figure 8B:
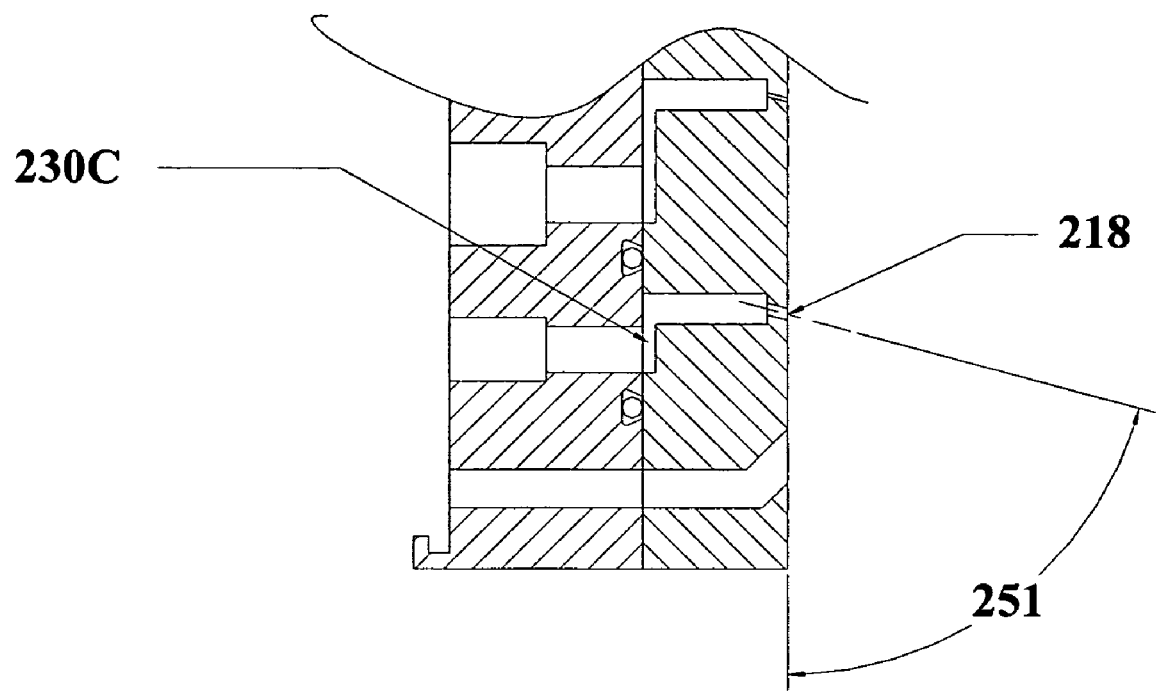

FIGS. 8A–8B illustrate a first exemplary circular air zone pattern and a cross-sectional view of the head that generates the pattern of FIG. 8A. In this embodiment, six concentric air zones are provided by the nozzles 231B of FIG. 8B. The spacing between the concentric air zones may be regular or may vary, as shown by the area between zone 5 and zone 6. In various embodiments, the nozzles 231B of FIG. 8B are tilted at an angle outward 251 and the nozzles can be spaced apart from each other between approximately 0.06 inch and 0.25 inch (preferably about 0.1 inch). Each nozzle can be angled approximately between 0 and 45 degrees (preferably about 20 degree) and can have a nozzle diameter approximately between 0.01 inch and 0.06 inch (preferably 0.015 inch). Each zone can be separated by a distance approximately between 0.5 inch and 2.0 inch. (Preferably about 1 inch). In one embodiment to serve 200 mm wafer (shown in FIG. 8A), zone 1 has 1 nozzle, zone 2 has 24 nozzles, zone 3 has 86 nozzles, zone 4 has 150 nozzles, zone 5 has 212 nozzles, and zone 6 has 240 nozzles.

Figure 9:
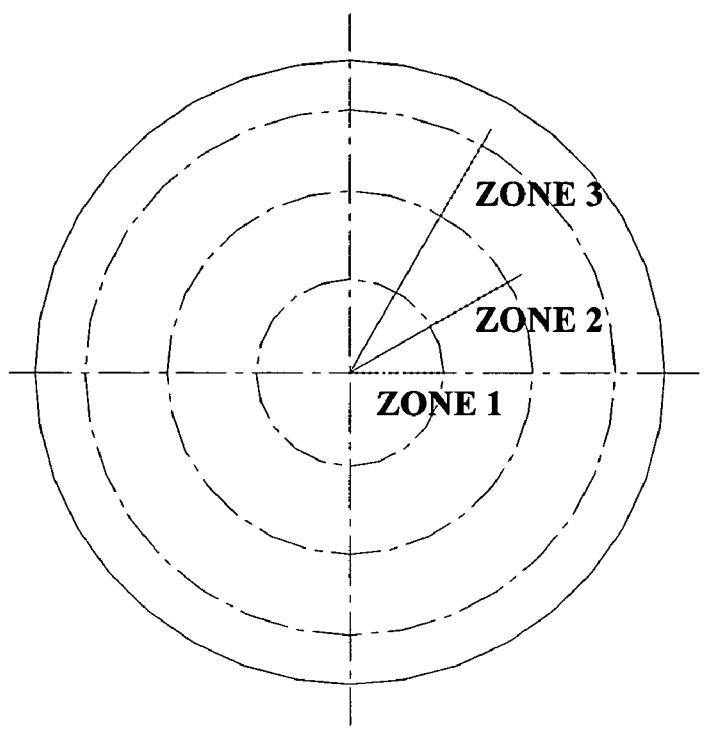
FIGS. 9–11 illustrate exemplary radial air zone patterns.
Figure 10:
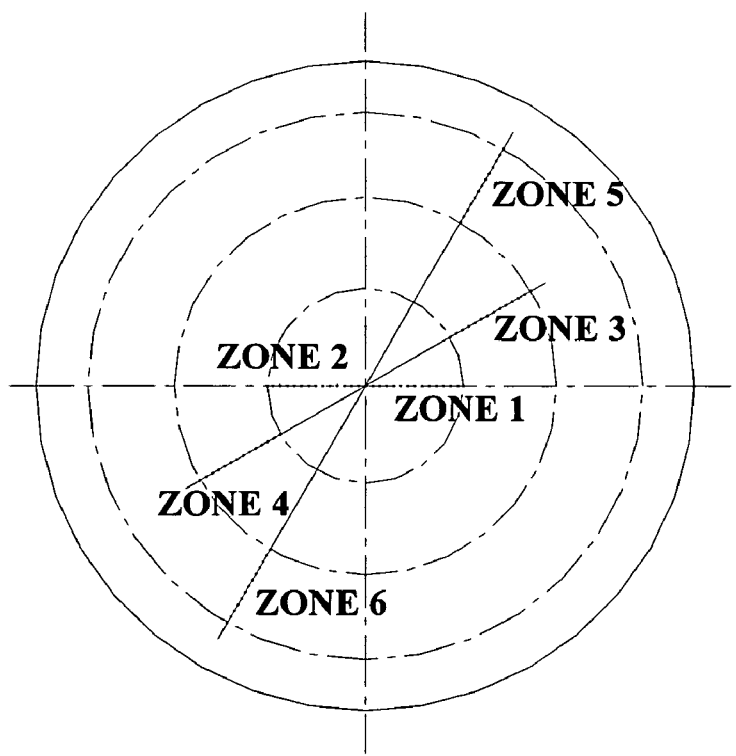
Figure 11:
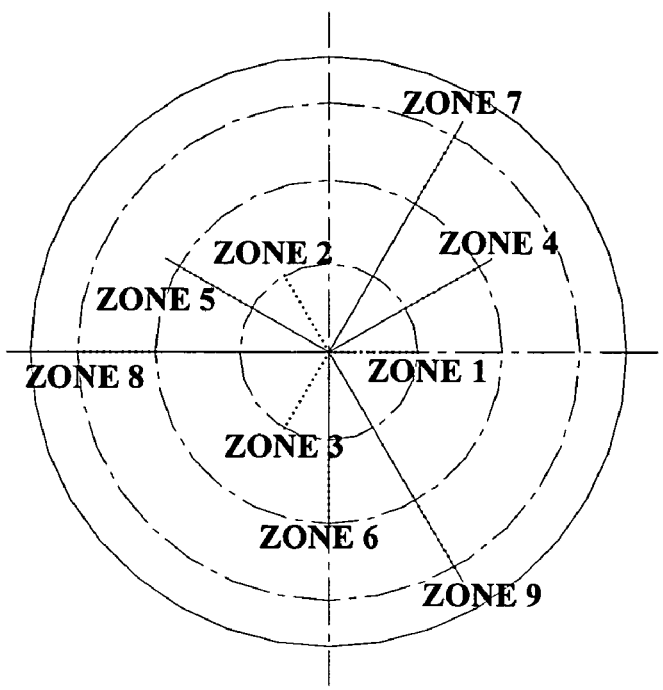

FIGS. 9–11 illustrate three additional exemplary radial air zone patterns. In the embodiment of FIG. 9, three radial air zones are provided by the nozzles 231B at predetermined angles 251. In the embodiment of FIG. 10, six radial air zones are provided by the nozzles 231B at predetermined angles 251. In the embodiment of FIG. 11, nine radial air zones are provided by the nozzles 231B at predetermined angles 251. The spacing between the air zones may be regular or may vary. The processing zones can include a plurality of nitrogen and IPA vapor air zones. The nozzles can be spaced apart from each other between approximately 0.06 inch and 0.25 inch. Each nozzle can be angled approximately between 0 and 45 degrees and can have a nozzle size approximately between 0.01 inch and 0.04 inch. Each zone can be separated by a distance approximately between 0.5 inch and 1.5 inch. The plate surface can be a flat surface, a concave surface or a convex surface. The processing zones can be shaped as concentric rings, rectangular rings, linear rings, or radial rings. Alternatively, the processing zones can be circular zones, square zones, triangular zones, rectangular zones or linear zones. An outer processing zone can be used to dry a wafer edge.

Figure 12A:
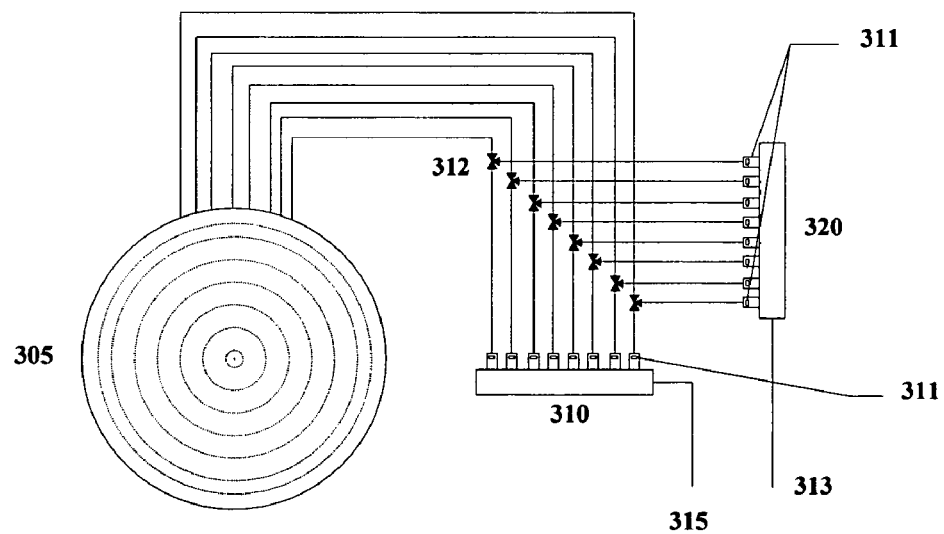
FIGS. 12A–12B illustrates exemplary systems for controlling the operation of the multi-zone shower head of FIG. 2.

In one embodiment shown in FIG. 12A, a first manifold 310 distributes an input gas 315 such as heated nitrogen to a manifold and control pressure regulators or MFC 311. Correspondingly, a second manifold 320 distributes an input vapor 313 such as N2/IPA mixture, or suitable vapor/mist to a manifold and control pressure regulator or MFC 311. The supply lines 313 and 315 are provided to an array of three-way valves 312. The valves 312 are controlled by a controller or computer and are selectively turned on to provide the gas to selected zone(s) on the wafer at selected times as needed.

Figure 12B:
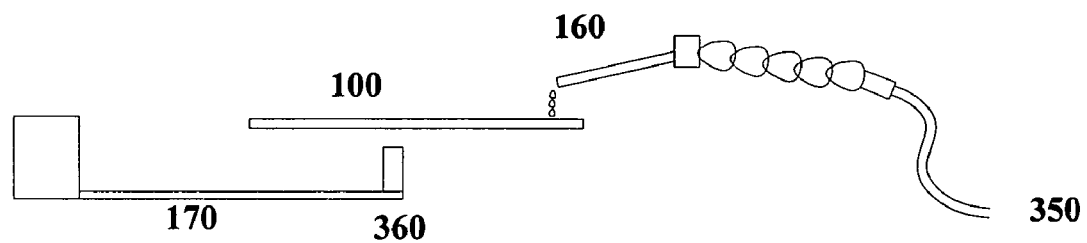

Turning now to FIG. 12B, an exemplary system for controlling the operation of one example of the heads 160 or 170 is shown. As shown in FIG. 12B, DIW or chemical can be provided to predetermined zones on top of the wafer 100 through nozzles 350, while cleaning/drying chemical can be provided to predetermined zones on the bottom of the wafer 100 through nozzles 360.

Figure 13:
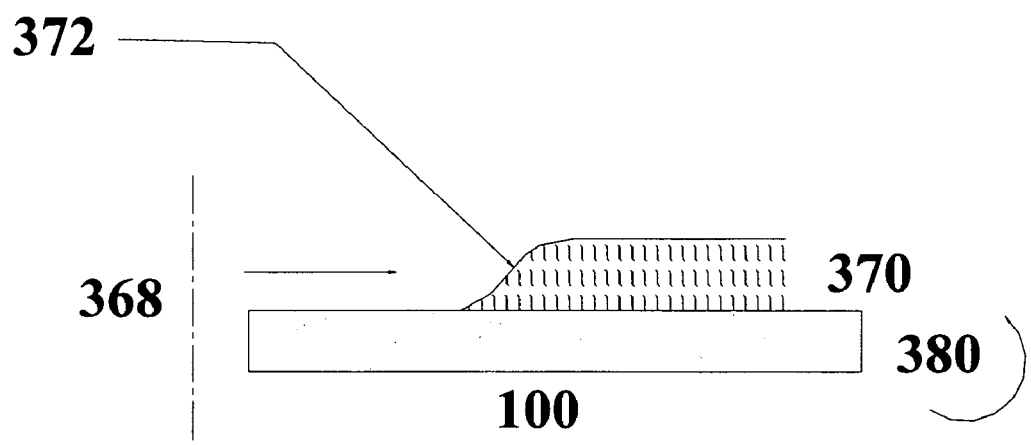
FIG. 13 illustrates an exemplary drying process for a wafer using the multi-zone shower head of FIG. 2.

FIG. 13 illustrates an exemplary drying process for a wafer using the shower head of FIG. 2. As illustrated therein, when the wafer 100 is spun, centrifugal force pushes the DIW 370 in a particular nitrogen and IPA zone 372 from the wafer center 368 toward the edge 380 of the wafer 100.

In drying a substrate, the drying apparatus increases the wet ability of the substrates or wafers and promotes the separation of water or fluid from the substrate and dries the substrate by transferring of thermal energy to the substrate. Since the N2/IPA vapor supplied to the interface between the substrate and the fluid has lower surface tension than the fluid does, the N2/IPA vapor dissolved on the top surface of the fluid in the bath promotes the removal of the fluid from the substrate while the substrate is pulled from the fluid in the bath. That is, the surface tension difference between the bulk fluid and the N2/IPA/fluid mixture promotes the separation of the fluid from the substrate. Further, the N2/IPA vapor increases the wet ability of the substrates.

As detailed in FIG. 14, an exemplary process for drying wafers is discussed next. A wafer handler pulls wafer 100 from a FOUP and placed on the apparatus of FIG. 2. While wafer is in drying processes, N2/IPA vapor can be provided to the interface between wafers and DI water, and heated N2 can be used to provide additional drying of the wafer. As is typical, nitrogen is passed through a bubbler (not shown) that contains liquid IPA and is connected to the inlet manifold 313 of FIG. 12A. A SMR (Self-Metering Reservoir) bubbler can be used to generate the mixture. N2/IPA mixture also can be generated from atomizer nozzle chamber.

Figure 14:
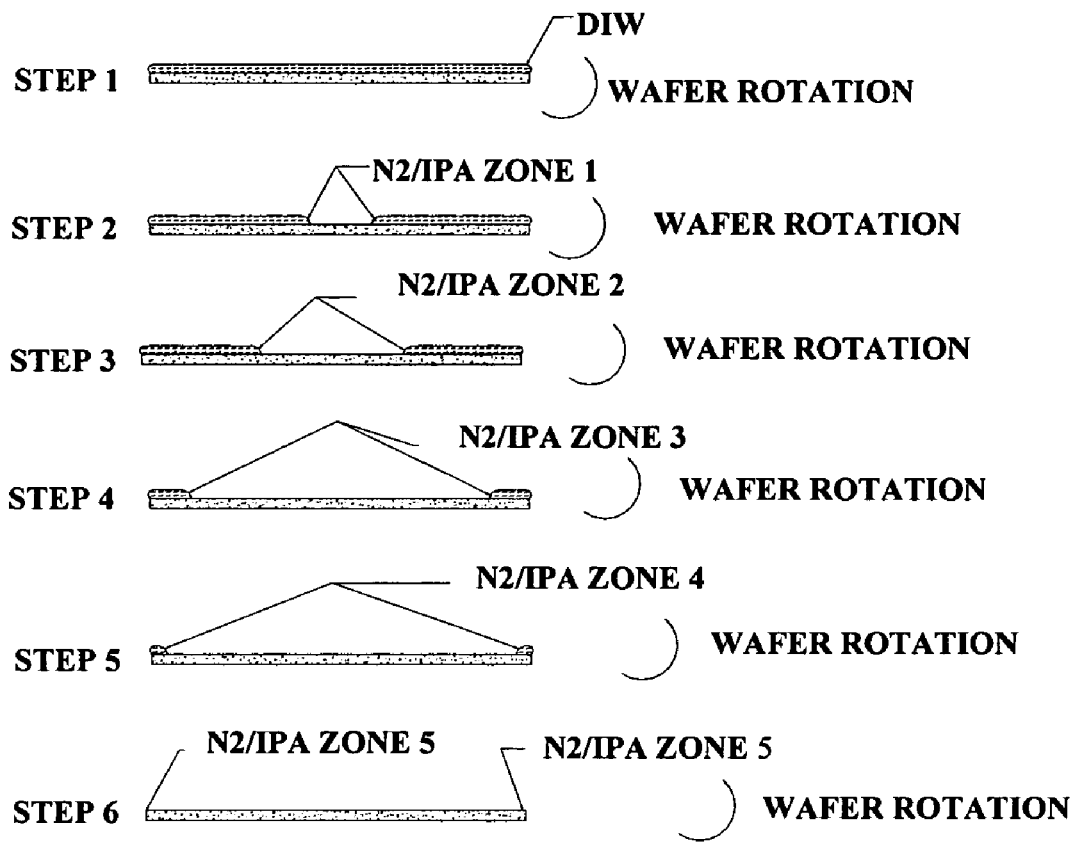
FIG. 14 illustrates an exemplary process for drying wafers.

In FIG. 14, while the wafer 100 is being slowly spun, a layer of DIW is flooded on the surface of the wafer. Next, pressure regulator or MFC 311 of zone 1 of the manifold 320 is actuated to turn the nozzle corresponding to $N_2$/IPA zone 1 (372). The nitrogen and IPA vapor is provided to the interfaces between the wafer 100 and DIW to increase the wet ability of the surface of the wafer 100 and to promote the removal of water and dry the wafer.

Next, pressure regulator or MFC 311 of zone 2 of the manifold 320 is actuated to turn the nozzle corresponding to $N_2$/IPA zone 2 (373). The pressure regulator or MFC 311 of zone 3 of manifold 320 is then actuated to turn the nozzle corresponding to $N_2$/IPA zone 3 (374). Next, the pressure regulator or MFC 311 of zone 4 of manifold 320 is actuated to turn the nozzle corresponding to $N_2$/IPA zone 4 (375). Finally, the pressure regulator or MFC 311 of zone 5 of manifold 320 is actuated to turn the nozzle corresponding to $N_2$/IPA zone 5 (376). Thus, the spinning of the wafer combined with selective activation of nozzles enable the DIW to be removed without staining the wafer with watermark, among others. The inner zone(s) can continuously flow the N2/IPA mixture or heated N2 while the outer zone(s) can perform dry processing.

The systems for drying of semiconductor wafers can be used in conjunction with processes such as post-CMP clean, Dry/wet Post-Etch Residue cleans (Polymer Removal), Photoresist Removal and surface preparation (FEOL & BEOL), Pre-Photo Lithography, Pre-Deposition clean and dry, Back Side Metals Clean, Back Side Films Etch (Front side and/or backside), Pre-Epi Clean, among others.

Figure 15:
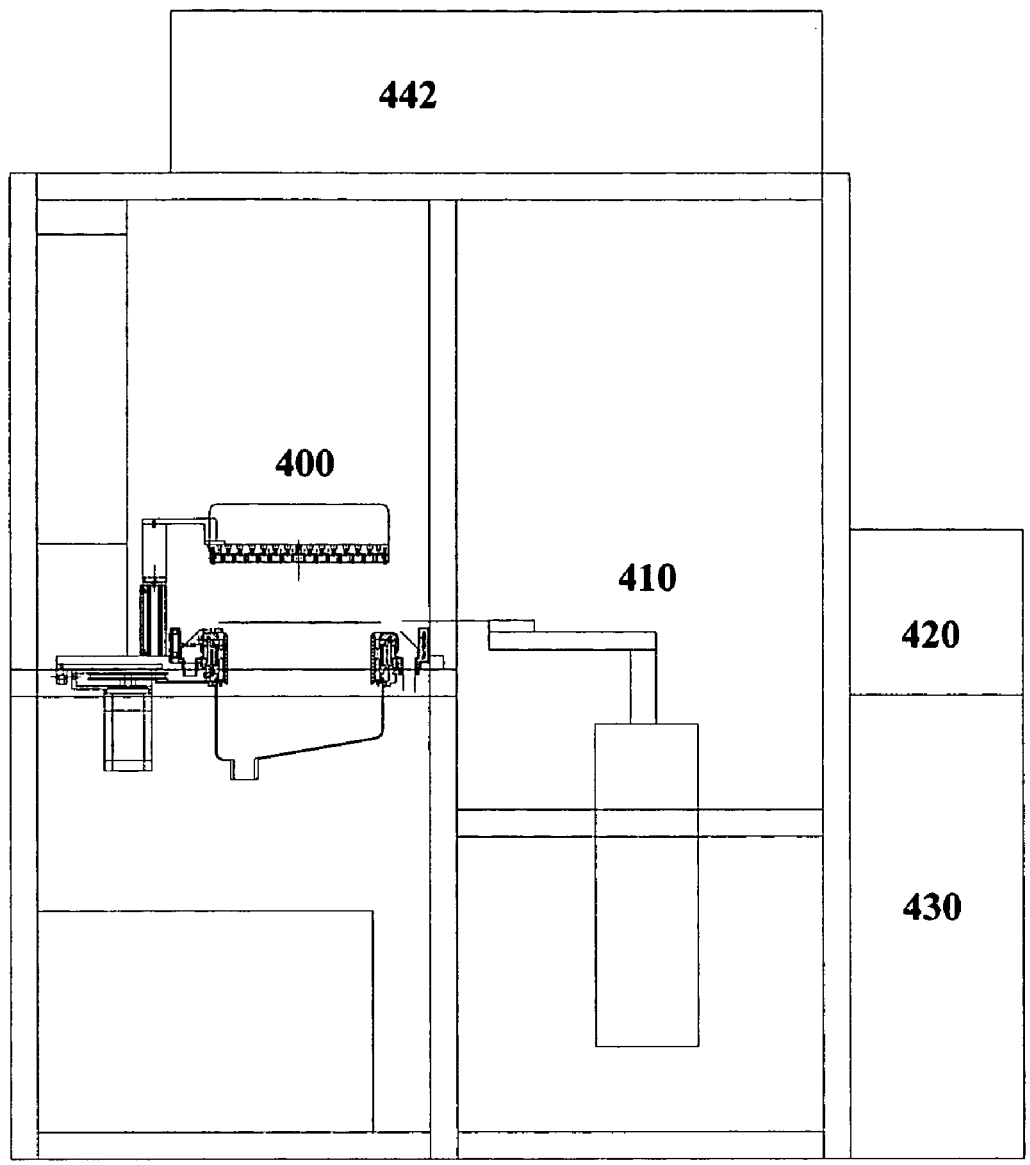
FIG. 15 illustrates an exemplary embodiment of a modular fabrication platform having one or more cleaning/drying modules.

The spinning apparatus of FIGS. 2–4 can be used as stand-alone module, modulated platform systems or integrated with other processing systems. FIG. 15 illustrates an exemplary embodiment of a modular fabrication platform having one or more cleaning/drying module.

In this embodiment, a processing module 400 such as the cleaner/dryer of FIGS. 2–4 is used in conjunction with a robot 410 and a front opening unified pod (FOUP) 420. To ensure purity, a filter 442 is provided to maintain the interior at a high level of cleanliness. The FOUP 420 enables conveyance of wafers via a room of low cleanliness or the outdoors. Hence, the FOUP 420 protects wafers from contamination with dust during conveyance. In one embodiment, a FOUP opener is disposed at the interface between the interior and exterior of a clean room. The FOUP opener includes a port plate having an opening portion, which can be opened or closed, and a port door for opening/closing the opening portion. The FOUP 420 has a door which faces the opening portion of the port plate. When wafers are to be unloaded from a space maintained at a high level of cleanliness (a first control space) within the FOUP in order to undergo processing steps, the FOUP door is opened. Unloaded wafers are robotically conveyed by the robot 410 within a wafer transfer space maintained at a high level of cleanliness similar to that in a processing chamber, and then transferred into the processing module 400. Processed wafers are returned from the processing module 400 to the space within the FOUP 420 by the robot 410. Thus, wafers are moved through the opening portion of the port plate. When no wafer is moved, the opening portion of the port plate is closed by means of the port door.

Although the invention has been described with reference to particular embodiments, the description is only an example of the inventor's application and should not be taken as limiting. Various adaptations and combinations of features of the embodiments disclosed are within the scope of the invention as defined by the following claims.

What is claimed is:

1. A system for fabricating a wafer having first and second sides, comprising:
    a platform adapted to receive and rotate said wafer;
    a shower head positioned above said first side, said shower head having a plurality of nozzles positioned thereon, each of said nozzles assigned to one of a plurality of processing zones for said wafer; and
    first and second nozzle heads coupled to the platform to deliver an input gas or an input vapor to said first and second sides of said wafer.

2. The apparatus of claim 1, comprising a drive assembly coupled to said platform.

3. The apparatus of claim 1, comprising a first bowl adapted to collect material from said first head and a second bowl adapted to collect material from said second head.

4. The apparatus of claim 1, comprising a moveable shroud to contain material from one or more of said heads.

5. The apparatus of claim 1, wherein at least one of said nozzles expels air, gas, or a mixture thereof.

6. The apparatus of claim 1, wherein at least one of said nozzles expels one of a liquid material, a chemical material.

7. The apparatus of claim 1, wherein at least one of said nozzles and heads emits ultrasonic energy.

8. The apparatus of claim 1, wherein said wafer is offset from said shower head.

* * * * *